United States Patent
Arakawa et al.

(10) Patent No.: US 7,754,981 B2
(45) Date of Patent: Jul. 13, 2010

(54) ELECTROMAGNETIC SHIELDING SHEET, FRONT SHEET FOR DISPLAY AND ELECTROMAGNETIC SHIELDING SHEET MANUFACTURING METHOD

(75) Inventors: Fumihiro Arakawa, Shinjuku-ku (JP);
Yasuhiko Ishii, Shinjuku-ku (JP);
Daisuke Hashimoto, Shinjuku-ku (JP);
Yukihiro Kyouden, Shinjuku-ku (JP);
Eiji Oishi, Shinjuku-ku (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 430 days.

(21) Appl. No.: 10/550,948

(22) PCT Filed: Apr. 19, 2004

(86) PCT No.: PCT/JP2004/005531
§ 371 (c)(1),
(2), (4) Date: Sep. 28, 2005

(87) PCT Pub. No.: WO2004/093513
PCT Pub. Date: Oct. 28, 2004

(65) Prior Publication Data
US 2006/0163197 A1    Jul. 27, 2006

(30) Foreign Application Priority Data
Apr. 18, 2003  (JP) .............................. 2003-113647

(51) Int. Cl.
*H05K 9/00* (2006.01)
(52) U.S. Cl. ..................................... 174/389
(58) Field of Classification Search ................. 174/389; 428/137
See application file for complete search history.

(56) References Cited

FOREIGN PATENT DOCUMENTS

| JP | A 61-15480 | 1/1986 |
|---|---|---|
| JP | A 5-283889 | 10/1993 |
| JP | A 9-293989 | 11/1997 |
| JP | A 10-335885 | 12/1998 |
| JP | A 11-174174 | 7/1999 |
| JP | A 11-337702 | 12/1999 |
| JP | A 2000-77887 | 3/2000 |
| JP | A 2002-9484 | 1/2002 |
| JP | A 2002-271086 | 9/2002 |
| WO | WO 2004016059 A1 * | 2/2004 |

\* cited by examiner

*Primary Examiner*—Roberts Culbert
(74) *Attorney, Agent, or Firm*—Oliff & Berridge, PLC

(57) ABSTRACT

A metal film 21 is laminated directly to or by means of an adhesive 13 to a transparent base sheet 11. A mesh metal film including lines defining apertures is formed by coating the metal film 21 with a mesh resist layer 109a patterned in a mesh, etching the metal film 21 through the mesh resist layer 109a, and removing the mesh resist layer 109a. The front surfaces and side surfaces of the lines of the mesh metal film are coated with a black coating layer 23.

5 Claims, 2 Drawing Sheets

ELECTROMAGNETIC SHIELDING SHEET, FRONT SHEET FOR DISPLAY AND ELECTROMAGNETIC SHIELDING SHEET MANUFACTURING METHOD

TECHNICAL FIELD

The present invention relates to an electromagnetic shielding sheet and more specifically, to an electromagnetic shielding sheet provided with a metal (thin film) mesh, to be disposed on the front surface of a display, such as a CRT (cathode-ray tube) or a PDP (plasma display panel), to intercept electromagnetic waves emitted by the display and to insure the satisfactory visual recognition of images displayed by the display, a method of manufacturing the electromagnetic shielding sheet, and a front sheet for a display.

BACKGROUND ART

Problems caused by electromagnetic interference (EMI) have increased with the functional advancement and the prevalent use of electric and electronic devices. Electromagnetic noises are classified roughly into conduction noises and radiation noises. A conduction noise elimination method uses a noise filter. One radiation noise elimination method uses a metal case for electromagnetically isolating a space, another radiation noise elimination method inserts a metal sheet between wiring boards, and a third radiation noise elimination method coats a cable with a metal foil. These methods are effective in electromagnetically shielding circuits and power source blocks. But the shielding members used by those methods are opaque and hence are not suitable for suppressing the radiation of electromagnetic radiation from displays, such as CRTs and PDPs.

The PDP includes, in combination, a glass panel provided with data electrodes and a fluorescent layer, and a glass panel provided with transparent electrodes. The PDP generates intense electromagnetic radiation, near-infrared rays and a large amount of heat when the PDP operates. Generally, a front sheet is disposed on the front surface of the PDP to suppress the radiation of electromagnetic radiation from the PDP. The front sheet must be capable of reducing electromagnetic radiation of frequencies in the range of 30 MHz to 1 GHz by 30 dB or above. Near-infrared rays of wavelengths between 900 and 1,100 nm emitted from the front surface of the display can make other devices, such as VTRs, malfunction. Therefore, near-infrared radiation must be suppressed along with electromagnetic radiation. The front sheet must have proper transparency, namely, a visible light transmitting characteristic or visible light transmittance, to make images displayed by the display clearly visible.

An electromagnetic shielding sheet included in the front sheet for displays has a metal mesh. Lines forming the metal mesh of the front sheet for electromagnetic shielding must be barely visible and scarcely light-reflective, and must have proper transparency and brightness to make displayed images clearly visible. There have not been any metal meshes capable of effectively dealing with electromagnetic shielding, infrared shielding and visibility improvement, to say nothing of metal meshes capable of providing electromagnetic shielding and visibility improvement on a practical level. An electromagnetic shielding sheet manufacturing method is required to be capable of stably manufacturing accurate electromagnetic shielding sheets by a small number of steps.

To deal with both electromagnetic shielding and transparency, some conventional electromagnetic shielding sheets are provided with a transparent base sheet coated with a thin film of a transparent conductor, such as a metal or a metal oxide, and other conventional electromagnetic shielding sheets are provided with a metal mesh consisting of fine lines of an opaque conductor, such as a metal. However, the electromagnetic shielding sheet provided with a thin film of a transparent conductor cannot deal with both electromagnetic shielding and transparency. Therefore, the electromagnetic shielding sheet provided with a metal mesh has been used prevalently in recent years.

The electromagnetic shielding sheet provided with a mesh of an opaque conductor performs electromagnetic shielding by the opaque conductor lines of the mesh and exercises transparency to image light by the apertures of the mesh. The outer surfaces of the lines of the mesh are coated with a black coating to prevent the reduction of contrast in images due to the reflection of external light, such as sunlight, by the light-reflecting lines of the mesh. An electromagnetic shielding sheet disclosed in Patent document 1 to improve the visibility of a displayed image includes a base sheet, a transparent anchoring layer, and an electroless-plated layer of a mesh pattern, in which the transparent anchoring layer underlying the electroless-plated layer is changed into a black-patterned layer by electroless plating. A method disclosed in Patent document 2 forms a copper oxide film on the surface of a metal mesh included in an electromagnetic shielding sheet to suppress the reflection of external light. A method of forming a mesh with black lines disclosed in Patent document 3 forms a metal mesh for an electromagnetic shielding sheet by a photoresist process using a black photoresist and leaves the black photoresist after the metal mesh has been formed. An electromagnetic shielding structure disclosed in Patent document 4 is formed by laminating a plastic film provided with a patterned copper foil patterned in a geometric pattern by a photolithographic process to a plastic sheet. A method of fabricating an electromagnetic shielding sheet disclosed in Patent document 5 forms a resin mesh of a radiation-curable resin, forms a metal mesh by coating the resin mesh with a metal layer by electroless plating, and blackens the surface and side surfaces of lines forming the metal mesh by oxidation or sulfidation. The metal meshes (lines) of all the electromagnetic shielding sheets fabricated by the methods mentioned in Patent documents 1 to 5 are not sufficiently dark and are unable to make displayed images clearly visible in a place illuminated by external light.

An electromagnetic shielding sheet disclosed in Patent document 6 has a metal mesh formed by lines having blackened outer and inner surfaces and blackened side surfaces. A method of fabricating this electromagnetic shielding sheet forms a laminated sheet by laminating a copper foil to a transparent base sheet by means of an adhesive such that the blackened surface, treated by a blackening treatment, of the copper foil is bonded to the transparent base sheet. However, since the blackened surface is roughened by the blackening treatment, an unsatisfactory adhesive film, such as an irregular adhesive film or an adhesive film containing bubbles, is formed to spoil the quality of the laminated sheet. The lines forming the metal mesh are often broken by etching. Since the other surface of the copper foil and the side surfaces of the lines are subjected again to a blackening treatment after laminating the copper foil to the transparent base sheet, this method needs to perform the blackening treatment twice. Thus this method is troublesome and reduces yield. Since the surface, facing the display, of the mesh is coated with a black layer, the mesh absorbs light emitted by the display and the brightness of the display is reduced.

Patent document 1: JP 5-283889 A
Patent document 2: JP 61-15480
Patent document 3: JP 09-293989 A
Patent document 4: IP 10-335885 A
Patent document 5: JP 11-174174 A
Patent document 6: JP 2002-9484 A

DISCLOSURE OF THE INVENTION

The present invention has been made to solve those problems and it is therefore an object of the present invention to provide an electromagnetic shielding sheet capable of being accurately fabricated by a small number of steps at high yield, of intercepting electromagnetic waves generated by a display when disposed on the front surface of the display and of making images displayed by the display satisfactorily visible, a method of manufacturing the electromagnetic shielding sheet, and a front sheet for a display.

The present invention provides an electromagnetic shielding sheet including: a transparent base sheet; and a mesh metal film attached to one of the surfaces of the transparent base sheet, including lines defining apertures; wherein a front surface not contiguous with the transparent base sheet and side surfaces of the lines of the mesh metal film are coated with a black coating layer formed by a blackening treatment, and the black coating layer has a reflection Y value greater than 0 and not greater than 20.

The electromagnetic shielding sheet according to the present invention capable of intercepting electromagnetic waves, not absorbing image light emitted by a display and capable of preventing the reduction of the brightness of a displayed image due to illumination by external light can be manufactured without increasing steps of a manufacturing process or reducing yield.

The electromagnetic shielding sheet of the present invention is characterized in that the black coating layer contains at least one of copper, cobalt, nickel, zinc, tin and chromium, or a compound of at least one of those metals.

The surface of the mesh metal film and the side surfaces (sections) of the lines forming the mesh metal film are blackened uniformly, and the electromagnetic shielding sheet can be bonded to the mesh metal film by high adhesive strength.

The electromagnetic shielding sheet according to the present invention is characterized in that the mesh metal film is formed of copper.

The electromagnetic shielding sheet according to the present invention disposed on the front surface of a display is capable of effectively intercepting electromagnetic waves generated by the display.

The present invention provides a front sheet for a display, including: an electromagnetic shielding sheet; and an absorptive layer capable of absorbing visible light and/or near-infrared radiation, or an antireflection layer, formed on the electromagnetic shielding sheet; wherein the electromagnetic shielding sheet includes: a transparent base sheet; and a mesh metal film attached to one of the surfaces of the transparent base sheet including lines defining apertures; front surfaces not contiguous with the transparent base sheet and side surfaces of the lines of the mesh metal film are coated with a black coating layer formed by a blackening treatment, and the black coating layer has a reflection Y value greater than 0 and not greater than 20.

The electromagnetic shielding sheet prevents the formation of moiré, absorbs unnecessary visible light of specific wavelengths and/or near-infrared radiation and improves the visibility of images displayed by the display.

The present invention provides an electromagnetic shielding sheet manufacturing method including the steps of: (a) laminating a metal film directly to or by means of an adhesive to a transparent base sheet; (b) forming a mesh metal film including lines defining apertures by forming a mesh resist layer patterned in a mesh on the metal film, etching the metal film through the mesh resist layer and removing the mesh resist layer; and (c) coating front surfaces and side surfaces of the mesh metal film with a black coating layer by a blackening.

The electromagnetic shielding sheet manufacturing method according to the present invention is capable of forming a laminated structure of a good quality including a uniform adhesive layer not containing many bubbles, needs a single cycle of the blackening treatment, and is capable of forming the mesh metal film without breaking the component lines of the mesh metal film and of producing the electromagnetic shielding sheet at high production efficiency and high yield.

BEST MODE FOR CARRYING OUT THE INVENTION

The applicant of the present patent application has been continuously making effort for the research and development of electromagnetic shielding sheets for displays. The applicant proposed electromagnetic shielding sheets employing a blacked mesh metal foil formed by etching in JP 11-174174 A (Patent document 1) and JP 2001-210988 A, and proposed an electromagnetic shielding sheet including a mesh metal film blacked by attaching copper-cobalt particles to its surface in JP 2002-230842 A. The present invention has been made through the improvement of those previously proposed inventions.

Preferred embodiments of the present invention will be described with reference to the accompanying drawings.

Figure 1:
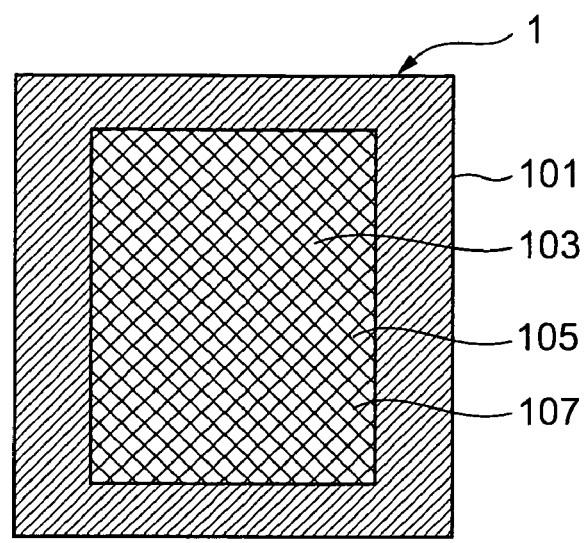
FIG. 1 is a plan view of an electromagnetic shielding sheet according to the present invention.

FIG. 1 is a plan view of an electromagnetic shielding sheet in a preferred embodiment according to the present invention.

Figure 2:
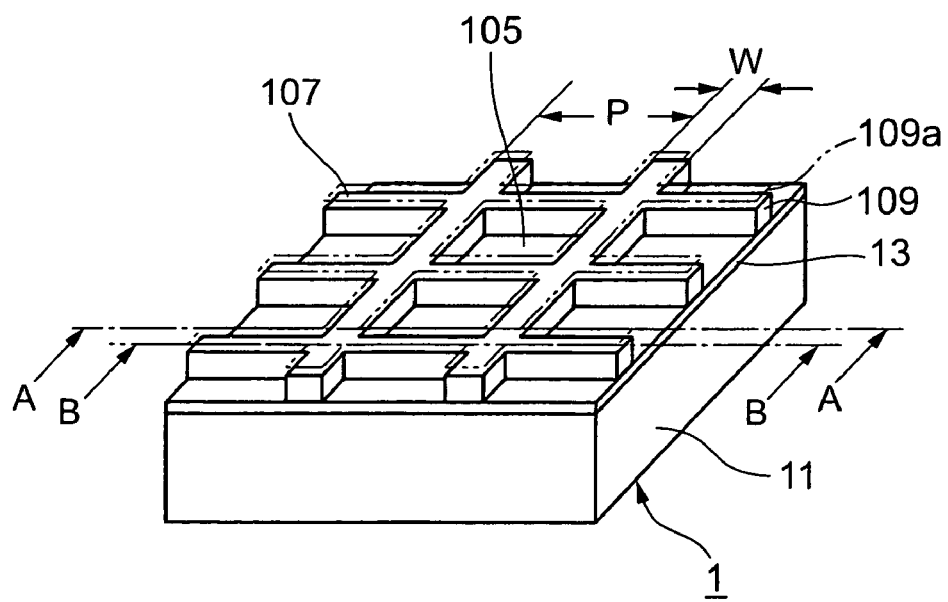
FIG. 2 is a fragmentary, typical perspective view of the electromagnetic shielding sheet according to the present invention.

FIG. 2 is a fragmentary, typical perspective view of the electromagnetic shielding sheet in the preferred embodiment according to the present invention.

Overall Construction

Referring to FIG. 2, an electromagnetic shielding sheet 1 according to the present invention includes a transparent base sheet 11, and a meshed conductor layer 109 formed on one of the surfaces of the transparent base sheet 11. The meshed conductor layer 109 includes a mesh metal film 21. As shown in FIG. 1, the meshed conductor layer 109 has a mesh part 103 and a grounding frame 101 surrounding the meshed part 103. As shown in FIG. 2, the mesh part 103 has a plurality of apertures (referred to also as "cells") 105 defined by lines 107. The grounding frame 101 is grounded when the electromagnetic shielding sheet is incorporated into a display.

As mentioned above, the conductor layer 109 including the mesh metal film 21 is attached directly to or attached by means of an adhesive layer 13 to one of the surfaces of the base sheet 11. The conductor layer 109 consists of the crossing lines 107 defining the apertures 105. The apertures 105 are arranged densely. The lines 107 are formed in a line width W and are arranged at pitches P as shown in FIG. 2.

Figure 3:
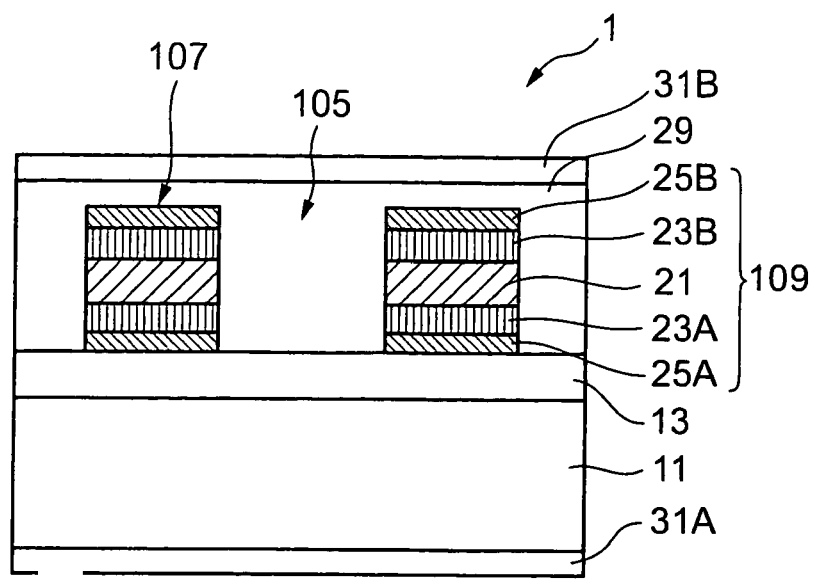
FIG. 3 is a sectional view of an essential part of a conventional electromagnetic shielding sheet.

FIG. 3 is a sectional view of an essential part of a conventional electromagnetic shielding sheet.

Figure 4:
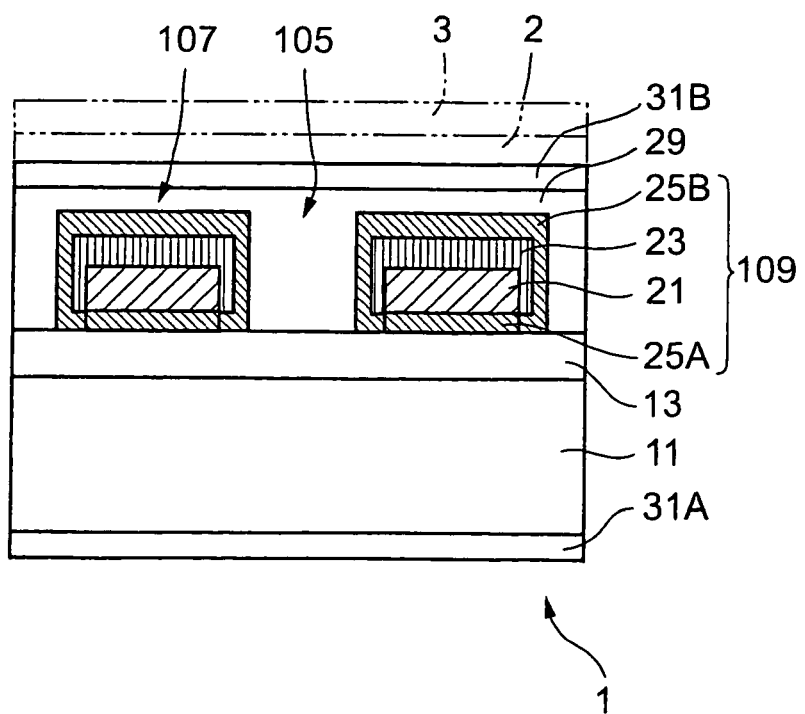
FIG. 4 is a sectional view of an essential part of an electromagnetic shielding sheet in an example of the present invention.

FIG. 4 is a sectional view of an essential part of the electromagnetic shielding sheet in the preferred embodiment according to the present invention.

Component Layers

FIGS. 3 and 4 are sectional views of the conventional electromagnetic shielding sheet and the electromagnetic shielding sheet according to the present invention, respectively, taken along the line crossing the apertures. In FIGS. 3 and 4, the apertures 105 and the lines 107 are arranged alternately. In FIGS. 3 and 4, the lines, as compared with the apertures, are shown in an exaggerated width and an exaggerated thickness. Referring to FIG. 3, black coating layers 23A and 23B are formed respectively on both the front surfaces of the mesh metal film 21 of each of the lines 107, and the side surfaces of the mesh metal film 21 are exposed.

The electromagnetic shielding sheet, not shown, disclosed in Patent document 6 having the metal mesh formed by the lines having blacked outer and inner surfaces and blacked side surfaces has problems that the laminated sheet is spoilt by an irregular adhesive film or an adhesive film containing bubbles, the lines forming the metal mesh are often broken, the two cycles of the blacking treatment reduces the yield, the electromagnetic shielding sheet reduces the brightness of the display.

Features of the Invention

In a method of manufacturing the electromagnetic shielding sheet 1 of the present invention, the mesh metal film 21 is laminated directly to or bonded to the metal film 21 by the adhesive layer 13 to one of the surfaces of the transparent base sheet 11, and the metal mesh is formed by a photolithographic process. The photolithographic process includes forming a resist layer having a mesh pattern on a metal film for forming the mesh metal film 21, etching the metal film through the resist layer to form the mesh metal film 21, and removing the resist layer. The mesh metal film 21 is subjected to a blacking treatment (blackening treatment) to form black layers (black coating layers) 23 coating the front surfaces and side surfaces of the lines of the mesh metal film 21.

The blacking treatment needs to be performed only once. Therefore, the shape of the lines defining apertures are not changed, the adhesive can be spread uniformly without containing bubbles, the laminated sheet can be formed in a good quality, the yield of the process is high and the electromagnetic shielding sheet can be produced at high production efficiency.

As shown in FIG. 4, each of the lines 107 of the meal layer 21 has a front surface, not facing the transparent base sheet 11, (referred to as "outer surface"), coated with the black layer (black coating layer) 23 and side surfaces coated with the black layer 23. When necessary, the black layers 23 may be coated with a rust-preventive layer 25B and/or a rust-preventive layer 25A may be formed between the mesh metal film 21 and the transparent base sheet 11.

The mesh metal film 21 consisting of the lines having side surfaces coated with the blacked layer 23 of the electromagnetic shielding sheet 1 of the present invention can intercept electromagnetic waves radiated by a display, the metal mesh (the lines) of the electromagnetic shielding metal mesh are scarcely visible, and the metal mesh does not reflect external light, such as sunlight and artificial illuminating light, fallen thereon. Consequently, the electromagnetic shielding sheet is capable of dealing with both electromagnetic shielding and transparency, and makes images displayed by the display clearly visible in high contrast even under a condition where external light falls on the screen of the display.

When necessary, the electromagnetic shielding sheet is processed by a planarizing process. When necessary, the electromagnetic shielding sheet is provided with a light-absorbing layer capable of absorbing visible light having specific wavelengths and/or near-infrared radiation. When the electromagnetic shielding sheet is disposed on the front surface of the display, electromagnetic waves radiated by the display are intercepted and the properly transparent electromagnetic shielding sheet makes imaged displayed by the display satisfactorily visible.

The method of manufacturing the electromagnetic shielding sheet of the present invention provided with the metal mesh formed by the lines having the outer surfaces and the side surfaces coated with the black layers will be described in terms of steps of the method and materials used by the method.

(a) Process of Bonding the Metal Film Directly to or Indirectly by Means of an Adhesive to the Transparent Base Sheet Transparent Base Sheet The transparent base sheet 11 may be formed of any one of suitable materials provided that the material has properties including transparency, insulation performance, heat resistance and mechanical strength capable of withstanding working conditions and manufacturing processes. Examples of possible materials are films of polyester resins including polyethylene terephthalate resins, polybutylene terephthalate resins, polyethylene naphthalate resins, ethylene glycol-terephthalic acid-isophthalic acid copolymers and terephthalic acid-cyclohexanedimethanol-ethylene glycol copolymers, coextruded films of polyethylene terephthalate resin/polyethylene naphthalate resin, films of polyamide resins including nylon 6, nylon 66 and nylon 610, films of polyolefin resins including polypropylene resins and polymethylepentene resins, films of vinyl resins including polyvinyl chloride resins, films of acrylic resins including polymethyl(meth) acrylate resins, polybutyl(meth)acrylate resins, and methyl (meth)acrylate-butyl(meth)acrylate copolymers ((meth) acrylate signifies acrylate or methacrylate), films of imide resins including polyimide resins and polyamide-imide resins, films of engineering resins including polyacrylate resins, polysulfone resins, polyether-sulfone resins, polyphenylene ether resins, polyphenylene sulfide resins (PPS resins), polyaramide resins, polyether ketone resins, polyether nitrile resins, poly(ether ether ketone) resins and polyether sulfide resins, films of styrene resins including polystyrene resins, and films of polycarbonate resins.

The transparent base sheet 11 may be a film of a copolymer or a mixture (or an alloy) of some of those resins or may be a laminated film. Although the transparent base film 11 may be an unstretched film, it is preferable in view of strength that the transparent base film 11 is a uniaxially stretched film or a biaxially stretched film. The thickness of the transparent base film 11 is between about 12 to about 1000 μm, preferably, between 50 and 700 μm. Most desirably, the thickness of the transparent base film 11 is between 100 and 500 μm. The transparent base film 11 has an insufficient mechanical strength and tends to warp or slacken if the thickness thereof is less than 100 μm. The transparent base film 11 has an excessively high quality and is uselessly expensive if the thickness thereof is greater than 500 μm.

The transparent base sheet 11 may be a film, a sheet or a board including at least one layer of one of the foregoing possible resins. Film, sheet and board will be referred to generically as "film" in this specification. Generally, biaxially stretched films of polyester resins including polyethylene terephthalate resins and polyethylene naphthalate resins are suitable films for use as the transparent base sheet 11 because films of polyester resins are satisfactory in transparency and heat resistance and inexpensive. Films of polyethylene terephthalate resins are optimum. Although films having higher transparency are desirable, films having a visible light transmittance of 80% or above are preferable.

The surface of the transparent base sheet 11 may be treated by preparatory treatments, such as a corona discharge treatment, a plasma treatment, an ozone treatment, a flame treatment, a primer coating treatment (a treatment for coating a surface with an anchor coat, a bond promoter or a prime coat), a preheating treatment, a dusting treatment, a deposition treatment and an alkali treatment. When necessary, the resin film may contain additives, such as a UV absorbent, a filler, a plasticizer and an antistatic agent.

Metal Film

The meshed conductor layer 109 for electromagnetic shielding includes the metal film 21 of a metal having a conductivity sufficient for electromagnetic shielding, such as gold, silver, copper, iron, nickel, chromium or aluminum. The metal film 21 may be formed of an alloy or may be a multilayer film. Normally, the metal film 21 is bonded to the transparent base sheet 11 by the adhesive layer 13. The metal film 21 may be directly formed on the transparent base sheet 11 by an electroless plating process or a vapor deposition process. Preferably, the metal film 21 is formed of a low-carbon steel, such as a low-carbon rimmed steel or a low-carbon aluminum-killed steel, a Ni—Fe alloy or Invar. If the blacking treatment is a cathodic electroplating process, it is preferable to form the metal layer 21 from a copper or copper alloy foil to facilitate electroplating. The copper foil may be a rolled copper foil or an electrolytic copper foil. An electrolytic copper foil is preferable because an electrolytic copper foil has a uniform thickness, has an affinity to a blacking treatment and/or a chromate treatment and is capable of being formed in a very small thickness of 10 μm or below. The thickness of the metal film 21 is between about 1 and about 100 μm, preferably, between 5 and 20 μm. The metal film 21 can be easily shaped in a mesh by a photolithographic process but has a high electrical resistance and a low electromagnetic shielding effect when the thickness thereof is below 5 μm. The metal film 21 cannot be formed in a mesh of a desired fineness, has a low aperture ratio and a low light transmittance, narrows viewing angle and deteriorates the visibility of images when the thickness thereof is greater than 20 μm.

Preferably, the surface roughness in the Rz system of the metal film 21 is between 0.5 and 10 μm. Reduction of reflection Y value below 20 by a blacking treatment is difficult, specular reflection of external light occurs and the visibility of images is deteriorated if the surface roughness of the metal film 21 is below 0.5. An adhesive cannot be uniformly spread over the surface of the metal film 21 or an adhesive layer formed on the metal film 21 contains bubbles if the surface roughness of the metal film 21 is greater than 10 μm. The surface roughness Rz is measured by a ten-point average method specified in B0601, JIS.

Laminating Method

The metal film 21 may be laminated to the transparent base sheet 11 by applying an adhesive or a pressure-sensitive adhesive to the transparent base sheet 11 or the metal film 21, drying the adhesive or the pressure-sensitive adhesive when necessary, superposing the transparent base sheet 11 and the metal film 21 in a superposed structure and applying pressure to the superposed structure while the superposed structure is heated or not heated to form a bonded structure, and, when necessary, subjecting the bonded structure to aging at a temperature in the range of 30 to 80° C. Thus, the transparent base sheet 11 and the metal film 21 are bonded together by the adhesive layer 13. This laminating process is generally called a dry lamination process. An ionizing radiation-curable resin, such as a UV-curable resin or an electron beam-curable resin, is preferable.

Adhesive

An adhesive for forming an adhesive layer employed in a dry lamination process or a nonsolvent lamination process may be a thermosetting resin or an ionizing radiation-curable resin. Possible thermosetting adhesives are urethane adhesives including two-part acryl-urethane adhesives, polyurethane adhesives and polyether-urethane adhesives, acrylic adhesives, polyester adhesives, polyamide adhesives, polyvinyl acetate adhesives, epoxy adhesives and elastomeric adhesives. Two-part urethane adhesives are preferable.

Pressure-Sensitive Adhesive

The pressure-sensitive adhesive may be any one of generally known pressure-sensitive adhesives. Possible materials suitable for use as pressure-sensitive adhesives are, for example, natural rubber, synthetic rubbers including butyl rubbers, polyisoprene rubbers, polyisobutylene rubbers, polychloroprene rubbers and styrene-butadiene copolymers, silicone resins including dimethyl polysiloxane, acrylic resins, vinyl acetate resins including polyvinyl acetate and ethylene-vinyl acetate copolymers, urethane resins, acrylonitrile resins, hydrocarbon resins, alkylphenol resins, and rosin resins including rosin, rosin triglyceride and hydrogenated rosin.

Adhesive or Pressure-Sensitive Adhesive Layer Formation

An adhesive solution, such as a latex, a water dispersion or an organic solvent solution of the adhesive, the pressure-sensitive adhesive or a mixture of some of the foregoing adhesives is applied in an adhesive film to one of two films, to be adhesively bonded together, by a known printing method, such as a screen printing method, or a known coating method, such as a comma coating method, a roll coating method or a curtain-flow coating method. The adhesive film is dried when necessary, and then the two films are superposed and compressed. More concretely, a laminating process unwinds a metal web for forming the metal film 21 and a resin web for forming the transparent base sheet 11 from rolls, applies the adhesive to either the metal web or the resin web in an adhesive film, dries the adhesive film, and then combines the metal web and the resin web, and compresses the superposed metal web and the resin web to form a laminated web. When necessary, the laminated web is aged for a period in the range of several hours to several days at a temperature in the range of 30 to 80° C., and winds the laminated web in a roll.

The dry thickness of the adhesive layer 13 is between about 0.1 and 20 μm, preferably between 1 and 10 μm. The resin web for forming the transparent base sheet and the metal web for forming the mesh metal film are superposed to form a laminated web immediately after forming the adhesive layer on either resin web for forming the transparent base sheet or the metal web for forming the mesh metal film, and the laminated web is subjected to aging for a period between several hours and several days at a temperature in the range of 30 to 120° C. or to curing for curing the adhesive to bond the resin web for forming the transparent base sheet and the metal web for forming the mesh metal film adhesively, The adhesive layer may be formed on either of resin web for forming the transparent base sheet and the metal web for forming the mesh metal film.

The adhesive layer 13 is omitted if the mesh metal film is formed directly on the transparent base sheet by electroless plating or the like.

(b) Process of Forming the Mesh Metal Film by Forming a Resist Film 109a of a Mesh Pattern on the Surface of the Metal Film 21 of the Laminated Web, Etching the Metal Web Through the Patterned Resist Film and Removing the Resist Film Masking The metal web for forming the mesh metal film 21 of the laminated web unwound from a laminated web roll is patterned in a mesh by a photolithographic process. The taut laminated web is fed continuously or intermittently and is subjected sequentially to a resist film forming step, a masking step, an etching step and a resist film removing step.

The masking step includes applying for example, a photoresist to the surface of the metal web for forming the mesh metal film 21 in a photoresist film, drying the photoresist film, exposing the dried photoresist film to light by a contact printing method through a photomask of a predetermined pattern corresponding to the pattern of the mesh metal film 21, developing the exposed photoresist film to form a patterned photoresist film, hardening the patterned photoresist film, and baking the hardened, patterned photoresist film.

The laminated web, i.e., a web including the transparent base sheet 11 and the mesh metal film 21, is unwound from a roll of the laminated web, the laminated web is moved continuously or intermittently, and the surface of the metal web for forming the metal film 21 is coated with a resist, such as casein, PVA or gelatin, by a dipping method, a curtain coating method or a flow coating method. A dry resist film may be attached to the surface of the metal web instead of coating the surface of the metal web with the resist. Use of the dry resist film facilitates work for coating the metal web with the resist. When the resist is casein resist, the resist film is baked at a baking temperature in the range of 200 to 300° C. Preferably, the lowest permissible baking temperature is preferable in view of preventing the warping of the laminated web.

Etching

The masked laminated web is subjected to an etching process. A ferric chloride solution and a cupric chloride solution, which can be easily circulated for continuous etching, are preferable etchants. An etching process and an etching system for processing the laminated web are basically the same as those etching a steel web of a thickness between 20 and 80 μm for manufacturing shadow masks for the screen of CRTs for color TV sets. Thus the existing shadow mask manufacturing system can be used for manufacturing the electromagnetic shielding sheet of the present invention. The shadow mask manufacturing system is able to continuously carry out a masking process and an etching process very efficiently. After the completion of the etching process, the laminated web is washed with water, the resist is removed by washing using an alkali solution, and then the laminated web is rinsed and dried.

Meshing

The framed mesh part 103 has the plurality of apertures 105 defined by the lines 107. There are not any particular restrictions on the shape of the apertures 105. For example, the shape of the apertures 105 may be a triangle, such as an equilateral triangle, a quadrilateral, such as a square, a rectangle, a rhombus or a trapezoid, an n-sided polygon (n is a natural number not smaller than three), such as a hexagon, a circle or an ellipse. The combination of those apertures can form a mesh. To form the mesh part 103 in a suitable aperture ratio and to make the meshes of the mesh part 103 invisible, the width of the lines defining the apertures is 25 μm or below, preferably, 20 μm or below. Although the lines of the electromagnetic shielding sheet 1 shown in FIG. 1 are inclined at 45° to the sides of the electromagnetic shielding sheet 1, the inclination of the lines may be selectively determined taking into consideration the pixels and light emitting characteristic of the display so that moiré may not be formed.

(c) Blacking Treatment for Forming the Black Coating Layer 23 on the Surface and Side Surfaces of the Lines of the Mesh Metal Film 21

Blacking Treatment

The meshed web of the laminated web for forming the mesh metal film, is subjected to a blacking treatment to black front surfaces and side surfaces of the lines defining the meshes. The blacking treatment includes roughening and/or blacking. The blacking treatment may include depositing a metal, an alloy, a metal oxide or a metal sulfide or applying a resin containing a black coloring matter on the front surfaces and side surfaces of the lines. A plating process is a preferable blacking treatment. A plating method is able to deposit a film on the surfaces and side surfaces of the lines of the mesh metal film so that the film can adhere strongly to those surfaces and to black (blacken) the front surfaces and side surfaces of the lines of the mesh metal film simultaneously, uniformly and easily. The plating process may be either an electroplating process or an electroless plating process. At least one metal selected from copper, cobalt, nickel, zinc, tin and chromium or a compound of some of those metals is used for plating. Films of other metals and compounds of other metals are not sufficiently black and do not adhere strongly to the front surfaces and side surfaces of the lines of the mesh metal film. Such an unsatisfactory condition is conspicuous, for example, when a plated film is formed by cadmium plating.

If the mesh metal film 21 is formed of a copper foil, a cathodic electroplating process is preferable. The cathodic electroplating process includes processing a copper foil by a cathodic electrolytic process in an electrolytic solution containing sulfuric acid, copper sulfate and cobalt sulfate to deposit cation particles. Cation particles can roughen and black the front surfaces and side surfaces. Cation particles are copper particles or particles of an alloy of copper and another metal. Preferably, the cation particles are copper-cobalt alloy particles.

The cathodic electroplating process is able to satisfactorily deposit particles of uniform particle sizes having a mean particle size in the range of 0.1 to 1 μm. When the copper foil is processed such that current density is high on the surface of the copper foil, the surface of the copper foil becomes cathodic, hydrogen is generated by reduction for activation and the adhesion of particles to the copper foil is enhanced remarkably.

Preferably, the mean particle size of the copper-cobalt alloy particles is in the range of 0.1 to 1 μm. Copper-cobalt alloy particles having a mean particle size greater than 1 μm reduces the thickness of the mesh metal film 21, deteriorates the workability of the mesh metal film 21 and it is possible that the mesh metal film 21 is broken when the mesh metal film 21 is laminated to the transparent base sheet 11. Copper-cobalt alloy particles having a mean particle size below 0.1 μm can not form satisfactorily rough surfaces and deteriorates the visibility of images.

The black coating layer 23 is described in detail in terms of copper-cobalt alloy particles in Jpn. Pat. App. No. 2002-230842 filed by the same applicant as the present invention patent application and in terms of copper particles in Jpn. Pat.

App. No. 2003-23290 filed by the same applicant as the present patent application. The copper particles and the copper-cobalt alloy particles may be blacked.

Plating Process for Blacking

The black layer 23 is formed on the front surfaces and side surfaces of the lines 107 of the mesh part 103 formed by etching by the foregoing method. Since the mesh metal film 21 formed by etching is a mesh structure, it is preferable to use a roller electrode for plating and to connect the front surface of the mesh metal film 21 to a ground. It is preferable to subject an etched metal web unwound from a roll to a plating process in view of facilitating the following processes for adhesive bonding, clarification and lamination.

Optical characteristics representing the visibility of the electromagnetic shielding sheet are expressed by a color specification system "L*, a*, b*, ΔE*" specified in Z8729, JIS. The meshed conductor layer 109 is less visible, contrast is higher and the visibility of images is more excellent when the absolute values of "a*" and "b*" are smaller.

In this specification, the blacking treatment includes both roughening and blacking. The preferable reflection Y value of blacked surfaces is not smaller than 0 and not greater than 20, preferably, in the range of 4 to 12. If the surface of the electromagnetic shielding sheet is faced outward, the reduction of contrast in images cannot be prevented and the visibility of images is unsatisfactory when external light, such as sunlight or lamplight, falls on the electromagnetic shielding sheet. Although there is not any lower limit of reflection Y value in principle, it is technically difficult to reduce reflection Y value substantially to zero. Reflection Y value is measured in a reflection mode by a method specified in Z8722, JIS using a chromoscope (CM-3700d, Minolta), in which a light source D65 is used, the angle of field is 2°, and light is projected to the surface of the mesh metal film. Optical reflectance is preferably less than 5%. The optical reflectance is measured by a method specified in k710-5, JIS using a haze meter (HM150, Murakami Shikisai).

The rust-preventive layer 25A may be formed on the mesh metal film 21 and/or the rust-preventive layer 25B may be formed on the black layers 23. At least the black layers 23 may be coated with the rust-preventive layer 25B.

The rust-preventive layers 25A and 25B prevent the mesh metal film 21 and the black layers 23 from rusting and, if the black layers 23 are layers of particles, the rust-preventive layer 25B prevents the particles from falling off and prevents the black layers 23 from deformation. The mesh metal film 21, the black layers 23, and the rust-preventive layers 25A and 25B used when necessary, constitute the mesh part 109 of the meshed conductor layer 109.

The rust-preventive layers 25A and 25B may be known ones. Preferable rust-preventive layers are those of nickel, zinc or copper oxide and those formed by a chromate treatment. The thickness of the rust-preventive layers 25A and 25B is between about 0.001 and about 1 μm, preferably, between 0.001 and 0.1 μm.

Chromate Treatment

The chromate treatment of the black layers 23 include wetting the black layers 23 with a chromating solution by a roll coating method, a curtain coating method, a squeeze coating method an electrostatic atomization method or a dipping method. The black layers 23 wetted with the chromating solution are dried without rinsing. Usually, the chromating solution is an aqueous solution containing 3 g/l $CrO_2$. Commercially available chromating solutions are, for example, Alsurf 1000 (Nippon Paint) and PM-284 (Nippon Parkerizing). The chromate treatment can enhance the effect of the blacking treatment.

The electromagnetic shielding sheet 1 thus obtained is disposed so that the transparent base sheet 11 faces the display and the blacked front surfaces faces a viewing side. When necessary, the electromagnetic shielding sheet 1 is planarized and, when necessary, the electromagnetic shielding sheet 1 is provided integrally with or combined with a light absorbing layer capable of absorbing visible light of specific wavelengths and/or near-infrared radiation, and/or an antireflection layer to form a front sheet for a display. The front sheet is disposed in front of the display. The front sheet is capable of intercepting electromagnetic waves generated by the display with a proper transparency, absorbing visible light of specific wavelengths and/or near-infrared radiation, preventing reflection and ensuring the satisfactory visibility of images displayed by the display.

Planarization (Leveling)

The thickness of the lines 107 of the mesh metal film is equal to that of the mesh metal film, and the mesh metal film 21 has the apertures (depressions) 105. Thus, the meshed conductor layer 109 has an irregular surface. When the irregular surface of the meshed conductor layer 109 is coated with an adhesive or a pressure-sensitive adhesive in the next process, the apertures 105 are filled up with the adhesive. Air will remain in the apertures 105 and adhesive filling up the apertures will contain bubbles if the adhesive has a high viscosity or process conditions for replacing air in the apertures with the adhesive are not satisfied. If the adhesive filling up the apertures contains bubbles, light is scattered and the clearness of images decreases and images whitens due to difference in refractive index between air and the adhesive. The inclusion of bubbles by the adhesive can be prevented by diluting the adhesive to reduce its viscosity, adjusting coating conditions, pressure application or vacuum suction. However, since those means are inefficient, it is preferable to fill up the apertures so as to planarize the surface.

Planarization (leveling) can fill up the apertures 105 with a transparent resin. Transparency of the transparent resin filling up the apertures 105 is deteriorated by bubbles contained in the transparent resin unless the apertures 105 are closely filled up with the transparent resin. Therefore, the viscosity of the transparent resin is reduced by diluting the transparent resin with a solvent or the like, the transparent resin having a low viscosity is applied to the meshed conductor layer and is dried or the transparent resin is applied to the meshed conductor layer deaerating the transparent resin to form a planarization layer (leveling layer) 29.

The planarization layer 29 may be formed of any suitable transparent resin provided that the transparent resin has high transparency, has a refractive index approximately equal to those of the adhesive layer 13 and the base sheet 11, and has high adhesion to the material forming the meshed conductor layer and to an adhesive to be used in the next process. If the surface of the planarization layer 29 has projections, depressions and/or irregularities, moire or interference fringes are formed when the electromagnetic shielding sheet is disposed in front of a display. In a preferable method, a thermosetting resin or a UV-curable resin is applied to the meshed conductor layer in a resin film, a releasable sheet having high planarity is attached to the surface of the resin film, the resin film is heated or irradiated with UV rays for curing, and then the releasable sheet is removed from the cured resin film. The planar surface of the releasable sheet is transferred to the surface of the planarization layer 29 to form the planarization layer 29 in a smooth surface.

The planarization layer 29 may be formed of any suitable resin chosen from various natural or synthetic resins, or thermosetting or radiation-curable resins. In view of durability, transparency, refractive index approximately equal to those of various resins, facility of application and planarization and flat ness, materials suitable for forming the planarization layer 29 are acrylic monomers, epoxy monomers, prepolymers and UV-curable resins containing those materials.

NIR Absorbing Layer

The resin forming the planarization layer 29 may contain a light absorbing agent capable of absorbing visible light rays and/or near-infrared rays of specific wavelength. A natural color tone of images and unpleasant sensation caused by imaged can be suppressed and the visibility of images can be improved by absorbing visible light rays of specific wavelengths. Such an effect is dependent on the type of the display. For example, image light emitted by a PDP includes, owing to the principle of PDP, light rays of wavelengths in the wavelength range of 570 to 605 nm of the spectrum of light emitted by neon atoms and the color tone of the images takes an orange tint.

The color of the image can be adjusted substantially to natural color by absorbing light of wavelengths in this wavelength range. Specific wavelength of near-infrared radiation (NIR) is in the range of about 780 to about 1100 nm. Near-infrared radiation of wavelengths in this wavelength range is used for transmitting signals to various remote-controlled devices and hence it is possible that such near-infrared radiation causes remote-controlled devices to malfunction. Therefore, it is desirable to absorb 80% or more near-infrared radiation of the wavelengths in the range of 780 to 1100 nm. Although there are not specific conditions for the near-infrared radiation absorbent (NIR absorbent), a coloring matter having a sharp absorption peak at the boundary between the visible light range and the near-infrared range, having a low transmittance to near-infrared radiation and a high transmittance to visible light and not absorbing visible light of specific wavelengths is a suitable near-infrared radiation absorbent. Preferable coloring matters capable of absorbing specific visible wavelengths are phthalocyanine compounds, anthraquinone compounds, coumarin compounds and methine compounds. Possible coloring matters capable of absorbing specific near-infrared wavelengths are immonium compounds, diimmonium compounds, cyanine compounds, phthalocyanine compounds, naphthalocyanine compounds, naphthoquinone compounds, anthraquinone compounds and dithiol complexes. A NIR absorbent is added to a planarization layer 29. If the planarization layer 29 does not contain any NIR absorbent, the electromagnetic shielding sheet 1 may be provided with a layer containing an NIR absorbent (NIR absorptive layer) at least on one of the surfaces thereof.

NIR Absorptive Layer

The NIR absorptive layer is formed on the planarization layer 29 and/or the transparent base sheet 11. In FIG. 4, a NIR absorptive layer formed on the planarization layer 29 is denoted by 31B and a NIR absorptive layer formed on the base sheet 11 is denoted by 31A. The NIR absorptive layers 31a and 31B may be NIR absorptive films containing a NIR absorbent, such as films No2832 commercially available from Toyobo, and bonded to the electromagnetic shielding sheet 1 with an adhesive or may be layers of a binder containing an NIR absorbent and applied to the surfaces of the electromagnetic shielding sheet 1. Possible materials as the binder are polyester resins, polyurethane resins, acrylic resins, heat- or UV-curable epoxy resins, and reactive polymers that are cured by the reaction of acrylate groups, methacrylate groups and isocyanate groups.

The planarization layer 29 and the NIR absorptive layers 31A and 31B respectively containing light absorbents absorb visible light or near-infrared radiation.

Antireflection Layer (AR Layer)

An antireflection layer (AR layer) 2 may be formed on the surface, on the viewer' side, of the electromagnetic shielding sheet to prevent reflection of visible external light, such as sunlight and lamplight, from the surface of the electromagnetic shielding sheet. Various single-layer and multiple-layer AR films are marketed. The multiple-layer AR film is formed by alternately superposing high-refractive layers and low-refractive layers. Possible materials for forming the high-refractive layer are niobium oxide, titanium oxide, zirconium oxide and ITO. Possible materials for forming the low-refractive layer are magnesium fluoride and silicon dioxide.

Hard Coating Layer, Antifouling Layer, Antiglare Layer

A layer 3, such as a hard coating layer, an antifouling layer or an antiglare layer, may be formed on the AR layer 2. The hard coating layer has a hardness of pencil hardness H or above as measured by a pencil hardness test method specified in K5400, JIS. Possible materials for forming the hard coating layer are functional (meth)acrylate monomers or prepolymers that can be cured by heating or exposure to ionizing radiation, such as polyester(meth)acrylate, urethane(meth)acrylate and epoxy(meth)acrylate. The antifouling layer is a water-repellent, oil-repellent coating. Possible materials for forming the antifouling layer are siloxane compounds and fluorinated alkylsilyl compounds. The antiglare layer has a minutely roughened surface capable of irregularly reflecting external light incident thereon.

Electromagnetic Shielding Sheet Formation

The laminated web thus fabricated and wound in a roll is unwound and is cut into individual electromagnetic shielding sheets 1. The electromagnetic shielding sheet 1 is attached to a transparent substrate, such as a glass substrate. When necessary, the electromagnetic shielding sheet 1 is combined with a NIR absorptive layer, an AR layer, a hard coating layer, an antifouling layer and an antiglare layer to form a front sheet for a display. A substrate for a large display is a rigid plate of a thickness between 1 and 10 mm. A substrate for a small display, such as a character display is a plastic film of a thickness between 0.01 and 0.5 mm. Proper substrates may be selected according to the size and uses of displays.

EXAMPLES

Example 1

A 10 µm thick electrolytic copper foil having a surface roughness Rz of 2 µm for forming a metal film 21 was bonded to a 100 µm thick polyethylene terephthalate film (PET film A4300, Toyobo) for forming a transparent base sheet 11 with a polyurethane adhesive layer 13 to form a laminated web. The laminated web was aged at 50° C. for three days. The polyurethane adhesive layer 13 was prepared by mixing a polyol (Takerakku A-310, Takeda Yakuhin Kogyo) as a chief ingredient and isocyanate (A-10, Takeda Yakuhin Kogyo) as a hardener. The dry thickness of the adhesive layer 13 was 4 µm.

The copper foil of the laminated web was processed by a photolithographic process to form a mesh foil as explained below. The laminated web was subjected continuously to a masking process and an etching process on an existing color TV shadow mask manufacturing line. The copper foil of the laminated web was coated with a positive photoresist, namely, casein, by a flow coating method to coat the copper foil with a positive photoresist film. Then the laminated web was fed intermittently to the next processing station to expose the positive photoresist film to UV radiation radiated by a mercury lamp through a mask having a negative pattern having 22 μm wide lines arranged at pitches P of 300 μm, defining square openings and inclined at an inclination of 45° to the sides of the transparent base sheet as shown in FIG. 1 in a contact exposure mode. Thus the laminated web is fed intermittently to successive processing stations for development, hardening and baking at 100° C.

Then, the laminated web was fed to the next etching station, where the copper foil was etched through the mask by a spray etching method using a ferric chloride solution heated at 50° C. and having a Baumé degree of 42°. Thus, mesh metal films 21 having lines 107 defining apertures 105 were formed. Then, the laminated web was fed to successive processing stations for washing, photoresist mask removal, rinsing and drying at 100° C. to complete mesh parts 103 of a shape as shown in FIGS. 1 and 2.

The mesh part 103 was subjected to a blacking treatment using an electroplating process to black the front surfaces and side surfaces of the lines 107. The mesh part 103 was immersed in a plating bath, namely, a mixed solution prepared by mixing a copper sulfate solution of 100 g/l copper sulfate concentration and a sulfuric acid solution or 120 g/l sulfuric acid concentration, kept at 35° C. for 10 s and a current was supplied in a current density of 20 A/dm². A black layer 23 was formed by repeating three cycles of the electroplating process to complete an electromagnetic shielding sheet 1 in Example 1.

Example 2

An electromagnetic shielding sheet in Example 2 was fabricated by the same method as that of fabricating the electromagnetic shielding sheet in Example 1, except that the former method used a mixed plating bath prepared by mixing a copper sulfate solution of 85 g/l copper sulfate concentration, a cobalt sulfate solution having of 15 g/l cobalt sulfate concentration and a sulfuric acid solution of 120 g/l sulfuric acid concentration.

Example 3

An electromagnetic shielding sheet in Example 3 was fabricated by the same method as that of fabricating the electromagnetic shielding sheet in Example 1, except that the former method used a mixed plating bath prepared by mixing a copper sulfate solution of 85 g/l copper sulfate concentration, a nickel sulfate solution having of 15 g/l nickel sulfate concentration and a sulfuric acid solution of 120 g/l sulfuric acid concentration.

Example 4

An electromagnetic shielding sheet in Example 4 was fabricated by the same method as that of fabricating the electromagnetic shielding sheet in Example 1, except that the former method used a mixed plating bath prepared by mixing a copper sulfate solution of 85 g/l copper sulfate concentration, a zinc sulfate solution having of 15 g/l zinc sulfate concentration and a sulfuric acid solution of 120 g/l sulfuric acid concentration.

Example 5

An electromagnetic shielding sheet in Example 5 was fabricated by the same method as that of fabricating the electromagnetic shielding sheet in Example 1, except that former method used a mixed plating bath prepared by mixing a copper sulfate solution of 85 g/l copper sulfate concentration, a chromium sulfate solution having of 15 g/l chromium sulfate concentration and a sulfuric acid solution of 120 g/l sulfuric acid concentration.

Example 6

An electromagnetic shielding sheet in Example 6 was fabricated by the same method as that of fabricating the electromagnetic shielding sheet in Example 1, except that the former method repeated two cycles of the electroplating process for a blacking treatment.

Example 7

An electromagnetic shielding sheet in Example 7 was fabricated by the same method as that of fabricating the electromagnetic shielding sheet in Example 1, except that former method performed a chemical conversion treatment. The chemical conversion treatment includes immersing the mesh part in a mixed solution prepared by mixing a sodium chlorite solution of 50 g/l sodium chlorite concentration and a sodium hydroxide solution of 20 g/l sodium hydroxide concentration and heated at 90° C. for 2 min. The front surfaces and side surfaces of the lines of the mesh copper foil were coated with a copper oxide for blacking.

Comparative Example 1

An electromagnetic shielding sheet in Comparative example 1 was fabricated by the same method as that of fabricating the electromagnetic shielding sheet in Example 1, except that the method used, instead of the copper foil employed in Example 1, a 10 μm thick electrolytic copper foil formed by depositing copper-cobalt alloy particles having a mean particle size of 0.3 μm on both the surfaces of a copper foil by cathodic electrodeposition and subjecting the copper foil to a chromating treatment and did not treat the side surfaces of lines 107 forming a mesh copper film by a blacking treatment.

Comparative Example 2

An electromagnetic shielding sheet in Comparative example 2 was fabricated by the same method as that of fabricating the electromagnetic shielding sheet in Example 1, except that the method includes performing only a single cycle of the electroplating process.

Evaluation

The electromagnetic shielding sheets were evaluated in terms of reflection Y value, visibility, bubble inclusion, etch irregularity, black irregularity and particle fastness.

Reflection Y value was measured by the aforesaid method.

Visibility was examined by disposing the electromagnetic shielding sheet in front of a PDP (WOOO®, Hitachi), successively displaying a test pattern, solid white and solid black, and visually observing the screen of the PDP in a viewing angle range of 0 to 800 with respect to a normal to the screen from a position 50 cm apart from the screen in a room illuminated by fluorescent lamps. Visibility was rated in terms of brightness, contrast, reflection of external light (lamplight) and glaring when the screen is in solid black, and blacking irregularity when the screen is in solid black. Electromagnetic shielding sheets that caused very bad visibility were rated unacceptable and were marked with a cross, those provided good visibility were rated acceptable and were marked with a circle and those provided practically acceptable visibility were rated acceptable and were marked with a triangle.

The electromagnetic shielding sheets were inspected for bubble inclusion visual observation using an optical microscope of 200× magnification. The electromagnetic shielding sheets including bubbles of diameters not smaller than 50 μm were rated unacceptable and were marked with a cross and those not including bubbles of diameters not smaller than 50 μm were rated acceptable and were marked with a circle.

The electromagnetic shielding sheets were inspected for etching irregularity by placing the electromagnetic shielding sheet on a light table. The electromagnetic shielding sheets illuminated from below were visually observed. The electromagnetic shielding sheet not having irregularly etched parts were rated acceptable and were marked with a circle. When the electromagnetic shielding sheet had irregularly etched parts, the lines forming the mesh metal film were visually observed using an optical microscope of 100× magnification. The electromagnetic shielding sheets having the lines having considerably irregular width were rated unacceptable and were marked with a cross.

The electromagnetic shielding sheets illuminated by fluorescent lamps were inspected for black irregularity by visual observation. The considerably irregularly blacked electromagnetic shielding sheets were rated unacceptable and were marked with a cross and the uniformly blacked electromagnetic shielding sheets were rated acceptable and were marked with a circle.

The surface of the mesh metal film was manually scrubbed ten times with absorbent cotton impregnated with ethyl alcohol, and the absorbent cotton used for scrubbing the surface of the mesh metal film was observed visually. When the absorbent cotton was soiled remarkably, the electromagnetic shielding sheets were rated unacceptable in particle fastness and were marked with a cross. When the absorbent cotton was soiled scarcely or lightly, the electromagnetic shielding sheets were rated acceptable in particle fastness and were marked with a circle. Results of evaluation are tabulated in Table 1.

with black layers formed by the blacking treatment. All the electromagnetic shielding sheets in Examples 1 to 7 were satisfactory in visibility, bubble inclusion etching irregularity, black irregularity and particle fastness and were acceptable. The electromagnetic shielding sheet in Comparative example 2 having the lines having front surfaces and side surfaces coated with the black layers had a reflection Y value of 22.0, the visibility of images displayed by the display when this electromagnetic shielding sheet was used was obviously inferior to images displayed by the display when the other electromagnetic shielding sheets were used, and the visibility was practically unacceptable. However, the electromagnetic shielding sheet in Comparative example 2 was satisfactory in bubble inclusion, etch irregularity, black irregularity and particle fastness. The electromagnetic shielding sheet in Comparative example 1 having the lines having blacked back surfaces and not blacked side surfaces had a reflection Y value not greater than 20. Although images displayed by the display provided with the electromagnetic shielding sheet in Comparative example 1 was satisfactory when the images were viewed from a direction at a viewing angle of 0°, i.e., a direction along a normal to the screen, images were tinged with red and contrast in images was low when the images were viewed from directions at viewing angles greater than 0°. Thus the electromagnetic shielding sheet in Comparative example 1 was unacceptable in visibility, bubble inclusion and etch irregularity.

The electromagnetic shielding sheet manufacturing method of manufacturing the electromagnetic shielding sheet 1 of the present invention is capable of spreading the adhesive uniformly, of forming the adhesive layer scarcely containing bubbles and of building the laminated web of a good quality. The electromagnetic shielding sheet manufacturing method needs to perform only a single cycle of the blacking treatment, and is capable of forming the mesh metal film without

TABLE 1

| Item | Reflection Y value | Black layer | | | Visibility | Bubble inclusion | Eching irregularity | Black irregularity | Particle fastness |
|---|---|---|---|---|---|---|---|---|---|
| | | Surface | Side surface | Back surface | | | | | |
| Example 1 | 5.0 | Coated | Coated | Not coated | ○ | ○ | ○ | ○ | ○ |
| Example 2 | 5.3 | Coated | Coated | Not coated | ○ | ○ | ○ | ○ | ○ |
| Example 3 | 5.5 | Coated | Coated | Not coated | ○ | ○ | ○ | ○ | ○ |
| Example 4 | 6.0 | Coated | Coated | Not coated | ○ | ○ | ○ | ○ | ○ |
| Example 5 | 6.0 | Coated | Coated | Not coated | ○ | ○ | ○ | ○ | ○ |
| Example 6 | 12.0 | Coated | Coated | Not coated | ○ | ○ | ○ | ○ | ○ |
| Example 7 | 4.0 | Coated | Coated | Not coated | ○ | ○ | ○ | ○ | ○ |
| Comparative Example 1 | 4.8 | Coated | Not coated | Coated | X | X | X | ○ | ○ |
| Comparative Example 2 | 22.0 | Coated | Coated | Not coated | X | ○ | ○ | ○ | ○ |

RESULTS OF EVALUATION

Electromagnetic shielding sheets in Examples 1 to 7 had reflection Y values not greater than 20 and were provided with the lines 107 having front surfaces and side surfaces coated breaking the lines of the mesh metal film and of manufacturing the electromagnetic shielding sheet at a high yield and at high production efficiency.

The electromagnetic shielding sheet 1 of the present invention is capable of intercepting electromagnetic waves, and the surfaces and side surfaces of the lines of the mesh metal film 21 are coated with the black layers 23. Therefore, the electromagnetic shielding sheet 1 does not absorb image light emitted by the display and does not reduce the brightness of displayed images.

The front sheet employing the electromagnetic shielding sheet 1 of the present invention and disposed in front of the display intercepts electromagnetic waves generated by the display and ensures the satisfactory visibility of images displayed by the display.

Since the electromagnetic shielding sheet 1 is planarized and is provided with the light absorbing layer capable of absorbing visible light of specific wavelengths and/or near-infrared radiation when necessary, moiré will not be formed, visible light of specific wavelengths and/or near-infrared radiation is absorbed and, consequently, images displayed by the display are satisfactorily visible.

The invention claimed is:

1. An electromagnetic shielding sheet comprising:
   a transparent base sheet; and
   a mesh metal film attached to one of the surfaces of the transparent base sheet, including lines defining apertures;
   wherein a front surface not contiguous with the transparent base sheet and side surfaces of the lines of the mesh metal film are coated with a black coating layer formed by a blacking treatment, and a back surface contiguous with the transparent base sheet of the lines being uncoated with the black coating layer formed by the blacking treatment, and
   wherein the black coating layer has a reflection Y value greater than 0 and not greater than 20, and
   wherein the black coating layer includes copper-cobalt alloy particles.

2. The electromagnetic shielding sheet according to claim 1, wherein the black coating layer contains at least one of copper, cobalt, nickel, zinc, tin and chromium, or a compound of at least one of those metals.

3. The electromagnetic shielding sheet according to claim 2, wherein the mesh metal film is formed of copper.

4. The electromagnetic shielding sheet according to claim 1, wherein the mesh metal film is formed of copper.

5. A front sheet for a display, comprising:
   an electromagnetic shielding sheet; and
   an absorptive layer capable of absorbing visible light and/or near-infrared radiation, or an antireflection layer, formed on the electromagnetic shielding sheet;
   wherein the electromagnetic shielding sheet includes:
      a transparent base sheet; and
      a mesh metal film attached to one of the surfaces of the transparent base sheet, including lines defining apertures;
   wherein front surfaces not contiguous with the transparent base sheet and side surfaces of the lines of the mesh metal film are coated with a black coating layer formed by a blacking treatment, and a back surface contiguous with the transparent base sheet of the lines being uncoated with the black coating layer formed by a blacking treatment, and
   wherein the black coating layer has a reflection Y value greater than 0 and not greater than 20, and
   wherein the black coating layer includes copper-cobalt alloy particles.

* * * * *